United States Patent
Teshima et al.

(10) Patent No.: US 8,766,339 B2
(45) Date of Patent: Jul. 1, 2014

(54) HIGHLY EFFICIENT CMOS TECHNOLOGY COMPATIBLE SILICON PHOTOELECTRIC MULTIPLIER

(75) Inventors: Masahiro Teshima, Unterschleissheim (DE); Razmik Mirzoyan, Unterschleissheim (DE); Boris Anatolievich Dolgoshein, Moscow (RU); Ljudmila Aseeva, legal representative, Moscow (RU); Anatoly Pleshko, Moscow (RU)

(73) Assignee: Max-Planck-Gesellschaft zur Foerderung der Wissenschaften e.V. Hofgartenstr. 8, Munich (DE)

( * ) Notice: Subject to any disclaimer, the term of this patent is extended or adjusted under 35 U.S.C. 154(b) by 0 days.

(21) Appl. No.: 13/365,348

(22) Filed: Feb. 3, 2012
(Under 37 CFR 1.47)

(65) Prior Publication Data
US 2013/0181318 A1    Jul. 18, 2013

Related U.S. Application Data

(63) Continuation of application No. PCT/EP2009/005609, filed on Aug. 3, 2009.

(51) Int. Cl.
*H01L 31/107* (2006.01)
*H01L 27/144* (2006.01)

(52) U.S. Cl.
USPC ............. 257/292; 257/443; 257/463; 438/78

(58) Field of Classification Search
USPC ............. 257/14, 186, 292, 443, 463; 438/356
See application file for complete search history.

(56) References Cited

U.S. PATENT DOCUMENTS

| 5,596,186 A | 1/1997 | Kobayashi |
| 7,262,402 B2 * | 8/2007 | Niclass et al. ............. 250/214.1 |
| 7,714,292 B2 * | 5/2010 | Agarwal et al. .......... 250/370.01 |
| 7,759,623 B2 * | 7/2010 | Teshima et al. ............... 250/207 |

FOREIGN PATENT DOCUMENTS

| EP | 1755171 A1 | 2/2007 |
| JP | 08264755 A | 10/1996 |
| JP | 2007536703 A | 12/2007 |

(Continued)

OTHER PUBLICATIONS

Sadygov, et al., "Three advanced designs of micro-pixel avalanche photodiodes: Their present status, maximum possibilities and limitations", Nuclear Instruments & Method.s in Physics Research, Section—A: Accelerators, Spectrometers, Detectors and Associated Equipment, Elseviir, Amsterdam, NL, vol. 567, No. 1, Nov. 1, 2006, pp. 70-73.*

(Continued)

*Primary Examiner* — Olik Chaudhuri
*Assistant Examiner* — Nicholas Tobergte

(57) ABSTRACT

The present disclosure relates to photodetectors with high efficiency of light detection, and may be used in a wide field of applications, which employ the detection of very weak and fast optical signals, such as industrial and medical tomography, life science, nuclear, particle, and/or astroparticle physics etc. A highly efficient CMOS-technology compatible Silicon Photoelectric Multiplier may comprise a substrate and a buried layer applied within the substrate. The multiplier may comprise cells with silicon strip-like quenching resistors, made by CMOS-technology, located on top of the substrate and under an insulating layer for respective cells, and separating elements may be disposed between the cells.

20 Claims, 3 Drawing Sheets

(56) References Cited

FOREIGN PATENT DOCUMENTS

| JP | 2008103614 | 5/2008 |
|---|---|---|
| JP | 2008294411 A | 12/2008 |
| WO | 2008004547 A1 | 10/2008 |

OTHER PUBLICATIONS

International Search Report cited in related application No. PCT/EP2009/005609 dated May 19, 2010.
Sadygov, et al., "Three advanced designs of micro-pixel avalanche photodiodes: Their present status, maximum possibilities and limitations", Nuclear Instruments & Method.s in Physics Research, Section—A: Accelerators, Spectrometers, Detectors and Associated Equipment, Elseviir, Amsterdam, NL, vol. 567, No. 1, Nov. 1, 2006, pp. 70-73, XP025056291 ISSN: 0168-9002.
Sciacca, et al., "Silicon planar technology for single-photon optical detectors" IEEE Transactions on Electron Devices IEEE USA LNKO—001:10.1109/TEO.2003.812095, vol. 50, No. 4, Apr. 2003, pp. 918-925.
Cova; et al., "Avalanche photodiodes and quenching circuits for single-photon detection", Applied Optics vol. 35, No. 12, Apr. 20, 1996, pp. 1956-1976.
Japanese Office Action cited in Japanese Application No. 2012-523204 dated Aug. 3, 2009, 5 pgs.
English translation of Japanese Office Action cited in Japanese Application No. 2012-523204 dated Apr. 1, 2014, 4 pgs.

\* cited by examiner

HIGHLY EFFICIENT CMOS TECHNOLOGY COMPATIBLE SILICON PHOTOELECTRIC MULTIPLIER

RELATED APPLICATION

This application is a continuation of PCT Application No. PCT/EP2009/005609, filed on Aug. 3, 2009, entitled "HIGHLY EFFICIENT CMOS TECHNOLOGY COMPATIBLE SILICON PHOTOELECTRIC MULTIPLIER", at least some of which may be incorporated herein.

FIELD

The present disclosure relates to semiconductor optoelectronic devices and photodetectors with high efficiency of light detection, including the visible part of the spectrum. The photodetectors of this disclosure may be used in a wide field of applications to employ the detection of very weak and fast optical signals such as, for example, industrial and/or medical tomography, life science, nuclear, particle, and astroparticle physics etc.

BACKGROUND

A device for single-photon detection is known as a Single Photon Avalanche Detector-SPAD [e.g. "Avalanche photodiodes and quenching circuits for single-photon detection", S. Cova, M. Ghioni, A. Lacaita, C. Samori, and F. Zappa in APPLIED OPTICS vol. 35 No. 12, 20 Apr. 1996, and E. Sciacca, A. Giudice, D. Sanfilippo, F. Zappa, S. Lombardo, R. Concentino, C. Di Franco, M. Ghioni, G. Fallica, G. Bonanno, S. Cova, E. Rimini "Silicon Planar Technology for Single-Photon Optical Detectors", IEEE Transactions on electron devices, vol. 50, No. 4. April 2003], and this device comprises a silicon substrate with an epitaxial layer made on it, the epitaxial layer having on a surface a small (e.g., 10-200 microns) region (e.g., a cell) of conductive type opposite to the given layer conductive type. The cell may be supplied with reverse bias that exceeds a breakdown voltage. When a photon is absorbed in this region, a Geiger discharge takes place, and such a discharge may be limited with an external quenching resistor.

Such a single-photon detector (SPAD) may comprise a very small area or volume, and may not be able to measure the light flux intensity.

In order to eliminate these defects, a large number ($=10^3$) of such cells may be used, and located on a common substrate having an area equal to or larger than 1 mm². Respective cells work as the above described photon detector, and the device may detect light intensity proportional to the number of the worked cells.

Such type of device—the Silicon Photomultiplier (SiPM)—is described in patent RU 2004113616 with a priority of May 5, 2004 and European Patent Application EP 1 755 171 A1, published Feb. 21, 2007 "Silicon Photomultiplier (e.g., variants) and cell therefore". The SiPM comprises a silicon substrate, a plurality of cells (the sizes of which are 20-100 microns and which are located on a surface of the substrate in an epitaxial layer); respective cells may comprise an internal individual quenching resistor made of high resistance polysilicon and may be located on top of the silicon oxide layer which covers respective cells. The main defects of this device are the following:

the usage of high resistance polysilicon quenching resistors which are not CMOS-technology compatible;

the location of polysilicon quenching resistors on top of the silicon oxide layer requires the opening of many (e.g., ~few×10³) windows in silicon oxide layer for connection of quenching resistor with entrance window silicon layer of the SiPM—that leads to the loss of the photon detection efficiency (PDE) and makes the fabrication process more complicated;

the presence of epitaxy layer gives rise to the increasing of dark rate of the SiPM and also makes the fabrication process more complicated.

The present disclosure provides a cell for a silicon-based photoelectric multiplier which is easy and efficient to fabricate, and comprises a high efficiency of light detection while in operation. Advantageous embodiments are described herein.

The present disclosure provides a cell for a silicon based photodetector having high efficiency in a broad band of wavelengths with a coefficient of amplification up to approximately $10^7$ at least because of increased cell sensitiveness and significantly reduced dark rate, while maintaining a framework of CMOS technology. The present disclosure may also provide a silicon based photodetector comprising a plurality of such cells.

In one embodiment, the quenching resistor in the cell of the silicon-based photoelectric multiplier may be formed in an uppermost layer of the semiconductor body. That is, for example, the quenching resistor may be formed laterally besides the upper layer of the p-n junction of the device. The quenching resistor layer may thus be comprised of a semiconductor layer connected to a lateral side face of the upper layer of the p-n junction and extends in a direction away from the p-n junction to connect the p-n junction with a voltage distribution line. The quenching resistor layer, for example, may be fabricated as a well area in the upper surface of the semiconductor body comprising a dopant concentration in order to yield a desired resistance or resistivity value to function as a quenching resistor for quenching the avalanche current. The disclosure enables integration of fabrication of the quenching resistor layer into a CMOS fabrication process.

According to one embodiment, the voltage distribution layers and/or lines may be integrated within the CMOS fabrication process. The voltage distribution lines may be fabricated as well areas into the upper surface of the semiconductor body, these well areas comprising comparably high dopant concentration to function as electrically conductive lines.

A method of fabricating a silicon-based photoelectric multiplier is illustrated in FIGS. 2 and 3 and may be performed in the form of a complete CMOS fabrication process, the fabricating of respective layers which are of functional significance of the device would be integrated in the CMOS fabrication process. In particular the process may comprise providing a silicon substrate, fabricating a first layer of a first conductivity type, fabricating a plurality of second layers of a second conductivity type, and fabricating a plurality of quenching resistor layers and voltage distribution lines, the fabrication conducted preferably by ion implantation processes. Moreover a buried layer of a first conductivity type may be fabricated by a deep ion implantation process.

DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodi

DETAILED DESCRIPTION

Figure 1:
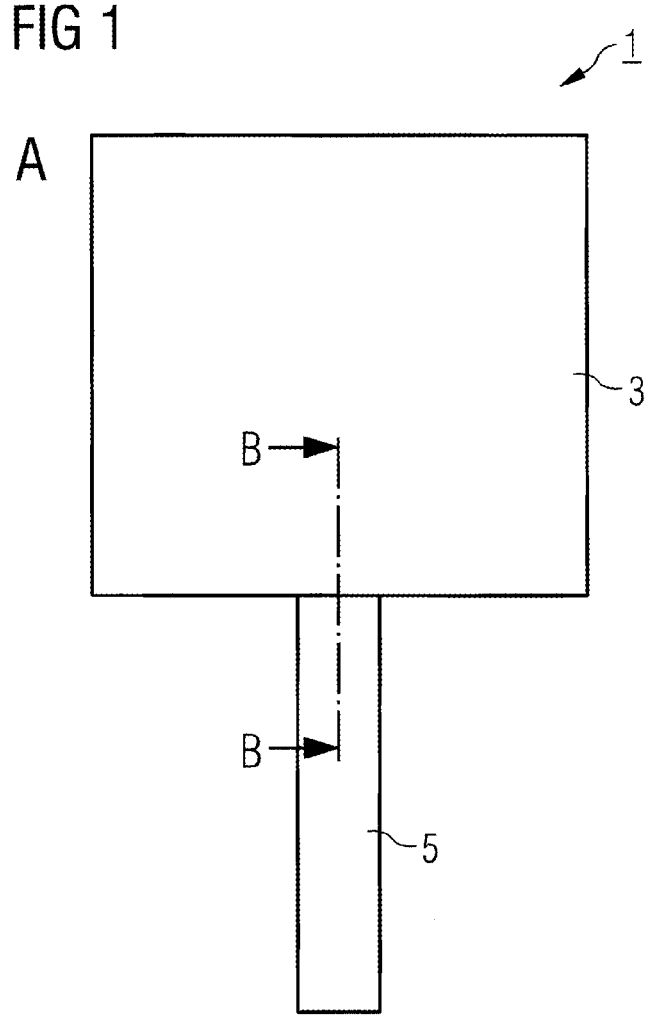
- FIGS. 1A, and 1B illustrate a top view representation (A) and a cross-sectional representation (B) of a cell of a silicon-based photoelectric multiplier according to an embodiment.
Figure 1:
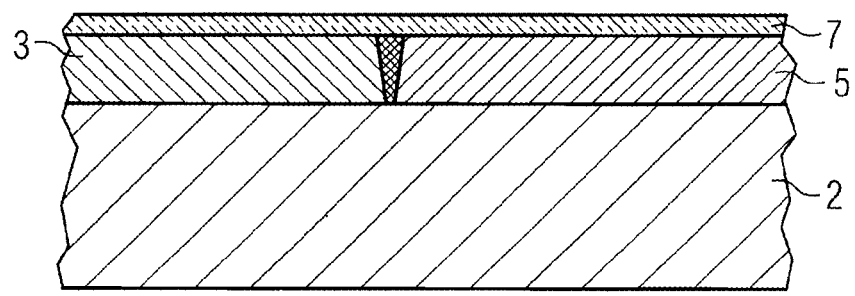

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. The following description is therefore not to be taken in a limiting sense, and the scope is defined by the appended claims. It should also be noted that the representations of the various layers, sheets or substrates in the Figures are not necessarily to scale.

In the following detailed description, reference is made to the accompanying drawings, which form a part thereof, and in which is shown by way of illustration specific embodiments in which the subject matter provided herein may be practiced. In this regard, directional terminology, such as "upper", "lower", "left-hand", "right-hand", "front side", "backside", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the subject matter provided herein.

FIG. 1A illustrates a top view representation of a cell of a silicon-based photoelectric multiplier according to an embodiment and FIG. 1B illustrates a cross-sectional representation of the cell along line B-B of FIG. 1A.

The cell 1 comprises a layer 2 of a first conductivity type and a layer 3 of a second conductivity type formed on the layer 2 so that the layer 2 and the layer 3 form a first p-n junction. The cell 1 comprises a quenching resistor layer 5 formed on the layer 2 laterally besides the layer 3 and connected to a lateral side face of the layer 3.

The cell 1 and layer 3 may comprise a rectangular or quadratic shape, and the quenching resistor layer 5 may be connected to one of the side edges of the layer 3 (e.g., in the center of the side edge). The quenching resistor layer 5 extends in a direction away from the layer 3 to make electrical contact to a voltage distribution line (not shown) remote from the layer 3. The cell 1 may comprise an insulation layer 7 covering the layer 2, the layer 3, and the quenching resistor layer 5. The insulation layer 7 may cover substantially the whole matrix of cells with merely one opening at an edge portion of the device for the purpose of electrically contacting the voltage distribution line. The layer 3 and the quenching resistor layer 5 may be formed as well areas into the layer 2 by using conventional ion implantation processes as known in CMOS fabrication technology. FIG. 1B illustrates the implantation region of the layer 3 left-hatched, the implantation region of the quenching resistor layer 5 right-hatched, and an overlap between respective regions may be provided when conducting the implantation to provide for a satisfactory electrical contact between respective regions.

It will be appreciated that the elements as shown in FIG. 1A may not be to scale with regard to dimensions with respect to each other, as well as the geometric dimensions of the elements themselves. For example, the quenching resistor layer 5 illustrated comprises a strip-like shape, the strip-like quenching resistor layer 5 may comprise, for example, a length to width ratio of greater than 10 (e.g., greater than 20 or 30). Moreover, the ratio of the length of a side edge of the cell 1 or of the layer 3 to the width of the strip-like quenching resistor layer 5 may be, for example, greater than 10 (e.g., greater than 20 or 30).

Further, the quenching resistor layer 5 may comprise a resistivity in the range of 10 to 50 kOhm/square, for example. With such a resistivity, the quenching resistor layer 5 may efficiently act as a quenching resistor for quenching the avalanche current in operation of the photodiode. The value of the resistivity may be adjusted by the geometric dimensions and the dopant concentration of the quenching resistor layer 5.

The layer 3 may comprise a relatively high level dopant concentration which may, for example, be in the range of $10^{18}$ to $10^{19}$ cm$^{-3}$.

Figure 2:
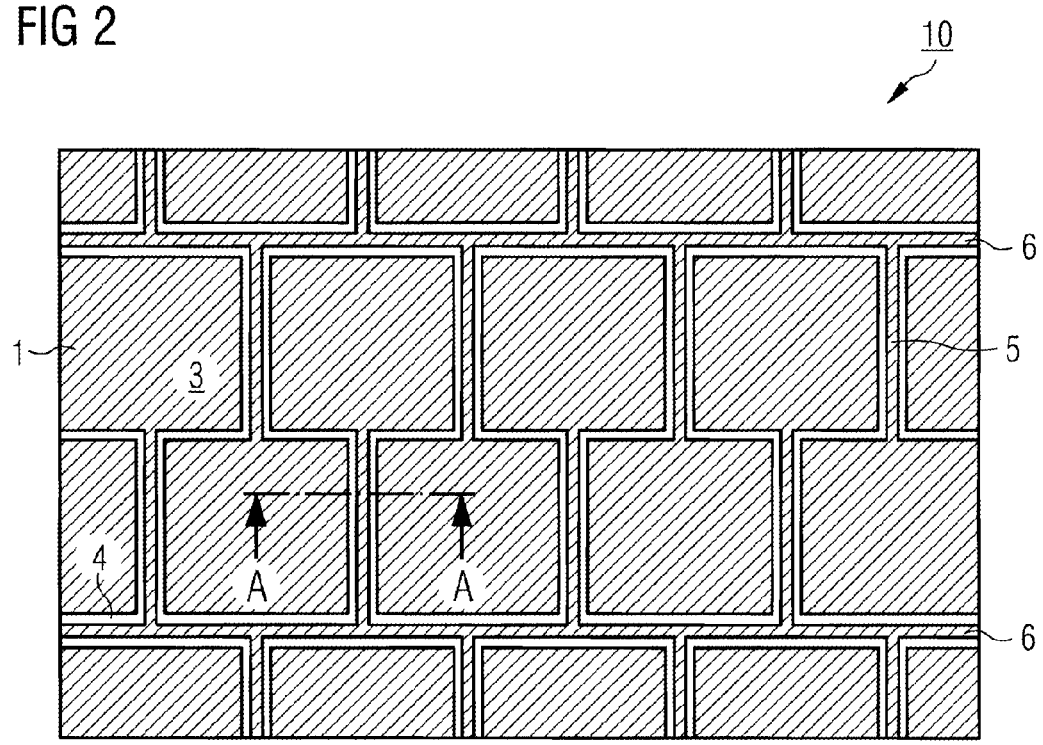
FIG. 2 illustrates a top view representation of a section of a silicon-based photoelectric multiplier according to an embodiment.

FIG. 2 illustrates a top view representation of a section of a silicon-based photoelectric multiplier according to an embodiment.

The photoelectric multiplier 10 depicted in FIG. 2 may be comprised of a plurality of cells 1 similar to those shown in FIGS. 1A, and/or 1B. The multipliers may be arranged along rows wherein the cells 1 of one row may be laterally displaced with respect to the cells 1 of an adjacent row, and the displacement may be, for example, half the length of one side edge of a quadratically shaped cell 1.

The photoelectric multiplier 10 may have a plurality of voltage distribution lines 6. In the section of the photoelectric multiplier 10 illustrated by FIG. 2 there may be two voltage distribution lines 6 arranged along outer side edges of two adjacent rows of cells 1. The quenching resistor layers 5 of each cell 1 of one row extend in the narrow space between two neighboring cells 1 of an adjacent row and may be electrically connected with the voltage distribution line 6 extending along the adjacent row. The voltage distribution lines 6 may comprise a well area formed within the layer 2. Voltage distribution lines 6 may be formed of well areas comprising a dopant concentration of about $10^{19}$ cm$^{-3}$ or $5 \times 10^{18}$ cm$^{-3}$ to $5 \times 10^{19}$ cm$^{-3}$ such that the lines may function as conductive wires. Thus, the fabrication of the voltage distribution lines 6 may be embedded within the CMOS fabrication process.

The top view representation of FIG. 2 illustrates the grooves 4 which surround each one of the cells 1 and prevent the penetration of secondary Geiger photons from one cell to the adjacent cells. The grooves 4 are shown in greater detail in an embodiment of a silicon-based photoelectric multiplier in FIG. 3.

Figure 3:
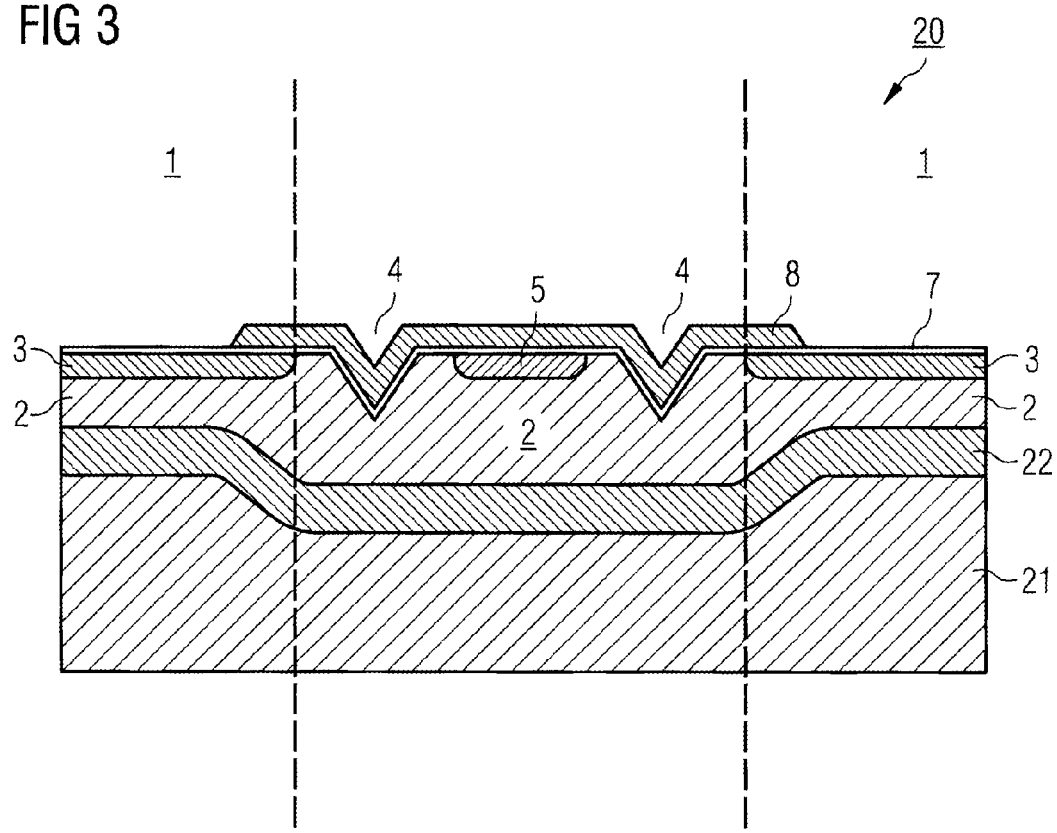
FIG. 3 illustrates a cross-sectional representation along line A-A of FIG. 2 of the silicon-based photoelectric multiplier according to an embodiment.

FIG. 3 illustrates a cross-sectional representation along line A-A of FIG. 2 of the silicon-based photoelectric multiplier according to an embodiment.

The section of the photoelectric multiplier 20 of FIG. 3 includes the right part of one cell 1 shown on the left side of the drawing and the left part of a further cell 1 shown on the right side of the drawing, and a region in between the adjacent cells 1, the region comprising a quenching resistor layer 5 and grooves 4. The photoelectric multiplier 20 comprises a substrate 21 of a second conductivity type comprising a relatively low doping agent concentration which may be, for example, in the range of $5\times10^{13}$-$5\times10^{14}$ cm$^{-3}$ and a buried layer 22 of a first conductivity type comprising a peak doping agent concentration in the range of $5\times10^{17}$-$5\times10^{18}$ cm$^{-3}$ and a gradient of doping concentration in the order of $10^{15}$-$10^{18}$ from up to down at least due to back scattering of implanted ions; such a gradient creates a built-in electric field. Accordingly, the field forces carriers generated by yellow-red photons in the doping gradient region to move into Geiger depletion region to be detected. Therefore, an increase of long wavelength photon detection efficiency may occur. The substrate 21 and the buried layer 22 form another N-P junction at an interface between them.

Above the buried layer 22 the plurality of identical cells 1 with the grooves 4 as separating elements between them is located, respective cells 1 may be formed by the layer 2 and the layer 3. The layer 2 is common for respective cells 1 and, may be contiguous throughout the photoelectric multiplier 20. The layer 3 may be formed as a thin layer of second conductivity type comprising a relatively high doping agent concentration, for example, $10^{18}$ to $10^{19}$ cm$^{-3}$, and disposed on top of the layer 2. The layer 3 may function as an entrance window of the photoelectric multiplier 20. The layer 2 and the layer 3 may form an N-P junction at an interface between the layers, and in operation a reverse bias voltage may be applied to the N-P junction to such an extent that the photodiode operates in the Geiger mode. The thin strip-like silicon quenching resistor layers 5 of second conductance type connect respective cells 1 with one of the voltage distribution lines 6 and serve as quenching resistors comprising a resistance of 10-50 kOhm/square. The voltage distribution lines 6 may comprise second conductivity type silicon layers having a relatively high doping agent concentration such as, for example, about $10^{19}$ cm$^{-3}$ or $5\times10^{18}$ cm$^{-3}$ to $5\times10^{19}$ cm$^{-3}$ of a doping agent concentration. The upper surface of the photoelectric multiplier 20 may be covered by an insulation layer 7, (e.g., a silicon oxide layer), with corresponding antireflection properties at an upper surface thereof. The strip-like quenching resistor layers 5 and voltage distribution lines 6 may be disposed between the layer 2 and the insulation layer 7. The voltage distribution lines 6 may be connected on a periphery of the photoelectric multiplier and there may merely be a single input power supply contact through a single opening window in the insulation layer 7. A grid-like aluminum layer 8 which is serving for the output of the SiPM signal may be disposed on top of the silicon oxide layer.

The photoelectric multiplier 20 according to FIG. 3 is an embodiment of a highly efficient CMOS-technology compatible photoelectric multiplier. The buried layer 22 may be formed by ion implantation carried out at an appropriate time in the course of the CMOS fabrication process. Additionally, other layers (e.g., such as the layer 3, the quenching resistor layers 5, and the voltage distribution lines 6, for example) may be processed by further ion implantation steps at appropriate times in the course of the CMOS fabrication process.

The silicon based photoelectric multiplier 20 may thus contain the substrate 21 of the second conductivity type, the buried layer 22 of the second conductivity type, a layer 2 of first conductivity type, a layer 3 of second conductivity type (e.g., entrance window), separation elements 4 (e.g., triangular grooves) between the cells 1, strip-like quenching resistor layers 5 (e.g., quenching resistors) of first conductivity type, voltage distribution buses 6, the insulation layer 7, and the grid-like layer 8 on top of the insulation layer 7.

As an example, the substrate 21 may comprise p-type (e.g., and/or n-type) conductivity, the buried layer 22 can have n-type (e.g., and/or p-type) conductivity, the layer 2 can have n-type (e.g., and/or p-type) conductivity, the layers 3 can have n-type (e.g., and/or p-type) conductivity, and the quenching resistor layers 5, and the voltage distribution lines 6 can have p-type (e.g., and/or n-type) conductivity.

It will be appreciated that according to the embodiment FIG. 3, the buried layer 22 may be fabricated as a non-planar layer, such that the buried lay may comprise varying depth throughout the device. In FIG. 3, it will be appreciated that in areas between the cells 1, the buried layer 22 is located deeper within the substrate as compared to the areas of the cells 1. The reason for this discrepancy is that the electric field may be higher within the cells 1, as compared to the areas between the cells 1 such that merely light which is incident on the cell 1 will be efficiently detected only by cell 1.

The highly efficient light detection in a broad part of the spectrum (e.g., 300 nm-700 nm) along with high uniformity of an electrical field may be reached in a structure as that illustrated in FIG. 3, manufactured based on a CMOS-technology process. A high electric field utilized for Geiger-type discharge (e.g., voltage above the breakdown value) may be created in the N-P junction between the layer 3 (e.g., entrance window) and the layer 2.

In another embodiment of FIG. 3, another N-P junction may be formed between the substrate 21 and the buried layer 22, the junction preventing penetration of photoelectrons, created by secondary photons of the Geiger discharge, into the volume of adjacent cells. The penetration of the secondary Geiger photons into the adjacent cells may be prevented by the separating elements 4 between the cells, which may serve as optical barriers formed as grooves (e.g., triangular V-grooves).

Highly Efficient CMOS-technology compatible photoelectric multipliers according to at least some of the above embodiments may comprise independent cells comprising 20-100 microns of size. That is, for example, a length of one side edge of one cell 1 or layer 3. Cells are jointed through quenching resistors 5 with voltage distribution buses 6, and the identical bias voltage, exceeding the breakdown voltage, may be applied to the cells 1 working in the Geiger mode. The quenched Geiger discharge may develop in the active region of the cell when a photon reaches the active region. The quenching that may stop the discharge takes place at least due to fluctuations of the number of the charge carriers up to zero when the voltage of the p-n boundary drops, due to availability of quenching resistor 5 (e.g., current-limiting resistor) in respective cells. The current signals from the worked cells may be summarized on a common load. The amplification of respective cells may reach $10^7$. The spread of amplification value is defined by technological spread of the cell capacity and breakdown voltage of the cell, and constitutes less than 5%. As respective cells are generally identical, the response of the detector to gentle light flashes is proportional to the number of worked cells (e.g., to light intensity).

What is claimed is:

1. A cell for a silicon-based photoelectric multiplier, comprising:
    a first layer of a first conductivity type;
    a second layer of a second conductivity type formed on the first layer, the first layer and the second layer forming a first p-n junction; and
    a quenching resistor layer of the second conductivity type fabricated as a first well area in the first layer laterally beside the second layer, the quenching resistor layer connected to a lateral side face of the second layer.

2. A silicon-based photoelectric multiplier, comprising a plurality of cells according to claim 1.

3. The silicon-based photoelectric multiplier of claim 2, comprising:
a voltage distribution layer of the second conductivity type formed on the first layer, the quenching resistor layer connected to the voltage distribution layer.

4. The silicon-based photoelectric multiplier of claim 3, the second layer formed as a second well area on the first layer and the voltage distribution layer formed as a third well area on the first layer, at least one of the first well area, the second well area, or the third well area comprising an upper surface coplanar with an upper surface of the first layer.

5. The silicon-based photoelectric multiplier of claim 2, the quenching resistor layer comprising a resistivity in the range of 10-50 k$\Omega$/square.

6. The silicon-based photoelectric multiplier of claim 3, the voltage distribution layer comprising a doping concentration in a range of $5\times10^{18}$ cm$^{-3}$ to $5\times10^{19}$ cm$^3$.

7. The silicon-based photoelectric multiplier of claim 2, the second layer comprising a doping concentration in a range of $10^{18}$ cm$^{-3}$ to $10$ cm$^{-3}$.

8. The silicon-based photoelectric multiplier of claim 2, comprising:
a substrate of the second conductivity type,
a doping buried layer of the first conductivity type, the substrate and the doping layer forming a second p-n junction, and
the plurality of cells arranged above the doping layer.

9. The silicon-based photoelectric multiplier of claim 8, the substrate comprising a doping concentration in a range of $10^{13}$-$10^{14}$ cm$^{-3}$.

10. The silicon-based photoelectric multiplier of claim 8, the doping buried layer comprising a peak doping concentration in a range of $5\times10^{17}$ cm$^{-3}$ to $5\times10^{18}$ cm$^{-3}$ and a gradient of doping concentration in the order of $10^{15}$ cm$^{-3}$ at an entrance window of the silicon-based photoelectric multiplier to $10^{18}$ cm$^{-3}$ at the peak concentration.

11. The silicon-based photoelectric multiplier of claim 2, the second layer surrounded by a groove formed in the first layer.

12. The silicon-based photoelectric multiplier of claim 2, the second layer comprising a quadratic shape and the quenching resistor layer connected to a side edge of the second layer.

13. The silicon-based photoelectric multiplier of claim 2, the quenching resistor layer extending laterally between a first cell of the plurality of cells and a second cell of the plurality of cells and between side faces of the second layers of the first cell and the second cell.

14. The silicon-based photoelectric multiplier of claim 2, the plurality of cells arranged along rows, cells of a first row laterally displaced with respect to cells of a second row adjacent to the first row, the quenching resistor layer of a first cell of the first row extending laterally between two cells of the second row and the quenching resistor layer of a first cell of the second row extending laterally between two cells of the first row.

15. The silicon-based photoelectric multiplier of claim 14, comprising:
a first voltage distribution layer extending along an outer edge of the first row of cells; and
a second voltage distribution layer extending along an outer edge of the second row of cells, the quenching resistor layer of the cells of the first row connected to the second voltage distribution layer; and
the quenching resistor layer of the cells of the second row connected to the first voltage distribution layer.

16. The silicon-based photoelectric multiplier of claim 2, comprising:
an insulation layer disposed on the first layer, the second layer, and the quenching resistor layer.

17. The silicon-based photoelectric multiplier of claim 16, the insulation layer disposed on a voltage distribution layer, the insulation layer comprising a through-connect opening for connecting the voltage distribution layer with an outer electrical contact.

18. The silicon-based photoelectric multiplier of claim 2, fabricated based at least in part on CMOS technology.

19. The silicon-based photoelectric multiplier of claim 2, operated in a Geiger mode.

20. The silicon-based photoelectric multiplier of claim 2, the quenching resistor layer comprising a length to width ratio of greater than ten.

* * * * *